United States Patent [19]

Nakano

[11] Patent Number: 5,784,410
[45] Date of Patent: Jul. 21, 1998

[54] RECEPTION AUTOMATIC GAIN CONTROL SYSTEM AND METHOD

[75] Inventor: Takayuki Nakano, Eatontown, N.J.

[73] Assignee: Matsushita Electric Industrial Co., Ltd., Osaka, Japan

[21] Appl. No.: 657,090

[22] Filed: Jun. 3, 1996

[51] Int. Cl.[6] .................................................. H04L 27/08
[52] U.S. Cl. .......................................... 375/345; 455/234.1
[58] Field of Search .............................. 375/345; 330/278, 330/254; 455/234.1, 245.1, 232.1; 348/678, 685

[56] References Cited

U.S. PATENT DOCUMENTS

| | | | |
|---|---|---|---|
| 5,448,595 | 9/1995 | Kaku et al. | 375/345 |
| 5,452,332 | 9/1995 | Otani et al. | 375/345 |

*Primary Examiner*—Stephen Chin
*Assistant Examiner*—Betsy L. Deppe
*Attorney, Agent, or Firm*—Amster, Rothstein & Ebenstein

[57] ABSTRACT

An automatic gain control system is disclosed which incorporates a control error amplitude limiting circuit to provide fine gain control for relatively small control error values, while providing limited gain renewal values to maintain amplifier stability for relatively large control error values. In another embodiment, an automatic gain control system is disclosed which incorporates a variable scaling means which scales the control error with coefficients selected in accordance with the positive or negative sign of the control error to provide maximum control loop response rates which are the same for both increases and decreases in signal power. Automatic gain control systems and methods are disclosed which respectively limit the control error amplitude and scale the control error with coefficients selected on the basis of the cotnrol error being either positive or negative, to provide improved, more precise, and more symmetrical amplifier gain control.

19 Claims, 12 Drawing Sheets

RECEPTION AUTOMATIC GAIN CONTROL SYSTEM AND METHOD

The present invention relates to an automatic gain control system and method for a communication system, and more specifically to an automatic gain control circuit for use in a receiver of a mobile communication system.

BACKGROUND OF THE INVENTION

Mobile communications systems face continual demands for increased subscriber capacity and improved signal reception. However, improvements in signal reception tend to require increased transmission power, which generally comes at the expense of subscriber capacity. Improvements are disclosed herein which aid in satisfying both of the foregoing demands.

In recent years, the Code Division Multiple Access (CDMA) Standard has been adopted for use in mobile communication systems, particularly in North America. Systems built according to the CDMA standard require an automatic gain control (AGC) circuit for providing a controlled reception signal level to permit adequate conversion of the reception signal from analog to digital form despite large fluctuations in the level of the detected input signal. An AGC system is disclosed herein which provides improved control over the reception signal level.

In a terrestrial mobile communication receiver, the detected input signal at any given location includes a plurality of multipath components. Multipath components result from the transmission of a signal along multiple paths due to the reflection, diffraction and scattering of radiowaves. When multipath components of a transmitted signal are in phase with each other, constructive interference results causing intensification of the received signal. However, when multipath components of a signal oppose each other in phase, destructive interference results, which reduces the amplitude of the received signal, often drastically.

When a mobile communication receiver is moved from place to place in a multipath transmission environment, the intensity of the electromagnetic field varies, often by an order of magnitude or more. Such variation in the electromagnetic field is called Rayleigh fading. The Rayleigh fading causes variations in the envelope of the signal amplitude and phase variations. While signal amplitude envelope variations follow a Rayleigh distribution, phase variations follow a uniform distribution.

In existing mobile communication systems which operate according to the CDMA Standard, a technology known as transmission power control has been used to compensate for variations in the strength of signals received from mobile communication transmitters resulting from the varying distances at which they are operated with respect to a base station. A description of transmission power control technology can be found in U.S. Pat. No. 5,056,109 ("the '109 Patent"). The '109 Patent describes a specific technique known as "open loop transmission power control" in which each mobile station estimates the loss in transmitted signal power from a base station by determining the received signal strength of a detected input signal. In that system, mobile stations use the estimated received signal strength to select a transmission power level so as to provide an expected signal to noise ratio at a base station on the receiving end.

Transmission power control techniques such as described in the '109 Patent are capable of compensating only for average transmission loss, a phenomenon which has origins and effects distinct from those caused by Rayleigh fading. Average transmission loss is primarily a function of the distance between a base station and a mobile station; its effects vary slowly in time. Transmission power control techniques are not intended to or capable of compensating for Rayleigh fading, a phenomenon which results in abrupt large fluctuations in received input signal level.

As stated above, mobile communication systems which employ transmission power control vary the transmission power according to the estimated received signal strength as determined by an automatic gain control (AGC) circuit of the mobile station. Consequently, the responsiveness and accuracy of the AGC circuit greatly affects the transmission power setting, and, in principle the overall performance of the mobile communication system, because more accurate transmission control permits larger groups of subscribers to be served with improved signal reception. Since the total transmission loss in mobile communication systems can reach 80 dB or more due to the combined effects of distance and interference, e.g., Rayleigh fading, and is subject to sudden, large amplitude fluctuations, an AGC circuit which responds quickly and operates stably under such conditions is essential.

The description of the prior art example AGC circuits and the several embodiments of the present invention are best understood by reference to the drawings incorporated herein. Accordingly, these drawings are described now.

BRIEF DESCRIPTION OF THE DRAWINGS

An AGC circuit of a prior art receiver system will now be described with reference to FIG. 1. In FIG. 1 an intermediate frequency amplifier 2 is used to amplify a detected intermediate frequency signal 1. An intermediate frequency/baseband conversion means 3 is used to down-convert the amplified intermediate frequency signal to baseband. An analog to digital (A/D) converter 4 then converts the baseband signal into a digital signal 5. The digital signal 5 is output from the AGC circuit to a digital demodulation circuit (not shown) and to a power calculation means 6.

Figure 1:
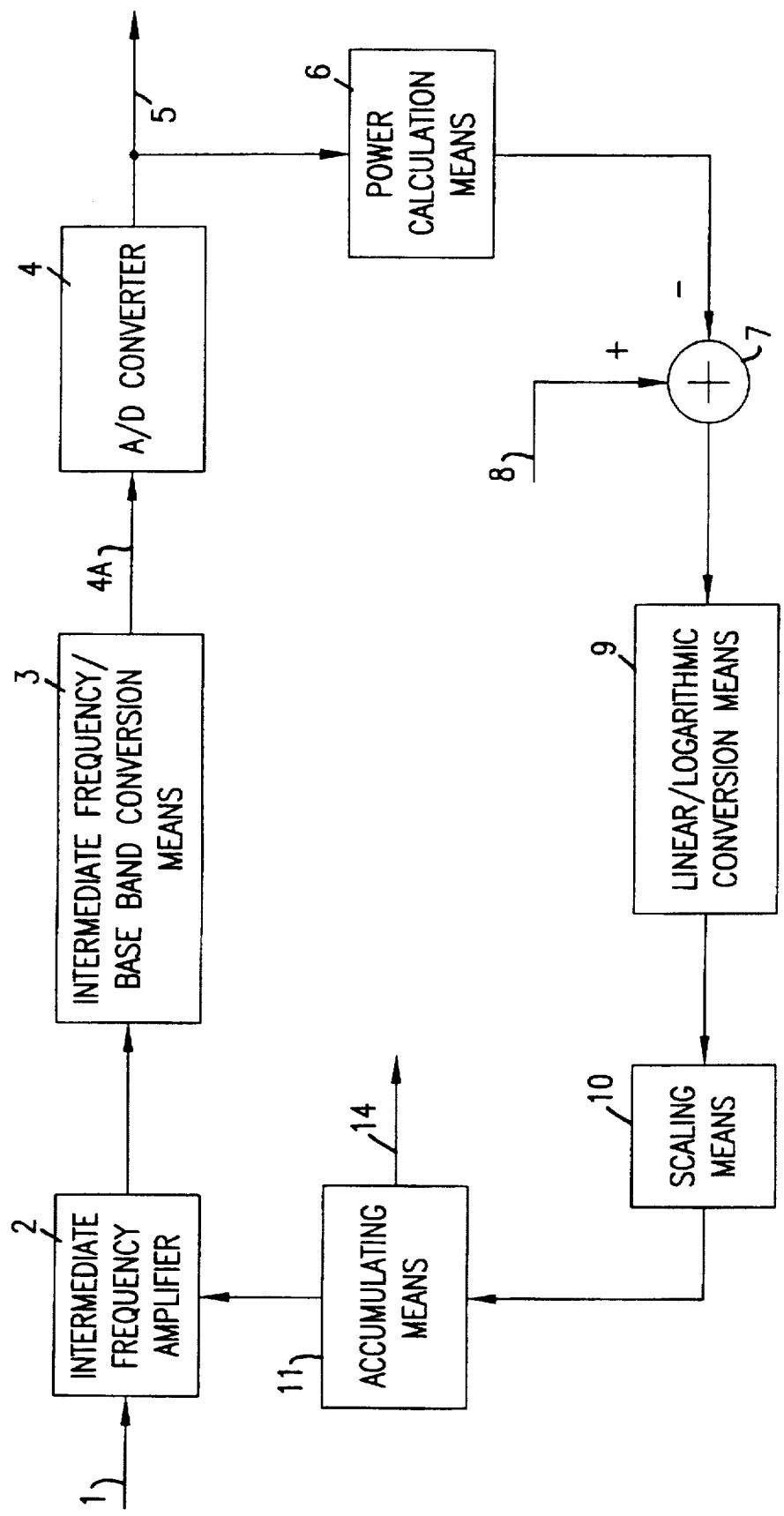
FIG. 1 is a block and schematic diagram of a first example of a prior art automatic gain control circuit.

The power calculation means 6 calculates the power of the digital signal 5. Control error detecting means 7 subtracts the calculated signal power from a reference value 8 to provide a control error signal. Linear/logarithmic conversion means 9 is used to convert the control error signal to a logarithmic scale. In existing systems, linear/logarithmic conversion means is performed by table-lookup (with the aid of a local storage) and substitution of values. In regions near zero dB on the linear scale, zero is substituted as a constant value because the log scale values tend towards minus infinity in those regions.

Scaling means 10 is used to multiply the logarithmic scale control error signal with a scaling coefficient to output a gain renewal value to accumulating means 11. Accumulating means 11 is used to add the gain renewal value to a previous gain control value to provide an updated gain control value to intermediate frequency amplifier 2. Accumulating means 11 is also used to convert the gain control value to an estimated received signal strength value (RSSI) 14, used, for example, for transmission power control.

The prior art AGC circuit of FIG. 1 operates to control the gain of the intermediate frequency amplifier 2 such that the baseband signal input level to A/D converter 4 is held constant. Control over the signal level at the input of the A/D converter 4 is effected through operations on digital signal 5. First, the power of digital signal 5 is calculated by power calculation means 6. The calculated power is then subtracted from a reference power level 8 by control error detecting means 7 to provide a control error signal.

Since the gain of the intermediate frequency amplifier 2 varies in exponential relation to the gain control value provided by accumulating means 11, the control error signal is converted to a logarithmic scale by linear/logarithmic conversion means 9 to effect linear feedback control. The logarithmic scale control error signal is then scaled by multiplication with a scaling coefficient in scaling means 10 and then provided as a gain renewal value to accumulating means 11. The scaling coefficient used in the AGC circuit determines the control loop response speed of the AGC circuit. That is, a larger scaling coefficient results in larger gain renewal value, which provides faster control loop response. A smaller scaling coefficient results in a smaller gain renewal value which provides slower control loop response.

After scaling, the accumulating means 11 adds the gain renewal value to the gain control value used in the previous control cycle to determine the gain control value for the present cycle. The relationship between the gain control value v and the gain g of the intermediate frequency amplifier 2 is provided by the formula:

$$g = G \exp[-\alpha v] \quad (1)$$

where G and α are constants having positive values. The overall input/output gain of the AGC circuit, assuming the level of the input signal 1 to be x and the level of the A/D converter input signal 4a to be y has the following relationship:

$$y = g x \quad (2)$$

(assuming the gain of the baseband conversion means 3 to be unity). Since the input signal level to the A/D converter 4 is controlled at a constant level, the estimated received signal strength value 14 in dB is given by the formula:

$$20 \log x = 20 \log (y/G) + 20\alpha v \log e \text{ (dB)} \quad (3)$$

As is apparent from Equation (1) above, the control loop response rate is an exponent of the gain renewal values which are produced by operation of the reception AGC circuit. Therefore, larger gain renewal values result in higher control loop response rates, while smaller gain renewal values result in lower control loop response rates. In the prior art example circuit of FIG. 1, the A/D converter 4 has a dynamic range of between −V and +V with the number of quantization steps M determined by bits N, such that $M=2^N$. As a result, the calculated signal power p output from power calculation means 6 has a value in the following range:

$$V^2/(M-1)^2 \leq p \leq V^2 \quad (4)$$

Thus, in the prior art circuit of FIG. 1, assuming the reference value 8 to be R and the coefficient used by the scaling means 10 to be K, the gain renewal value is determined by the following relation:

$$K \text{ sign } [R-p] \log (|R-p|) \quad (5)$$

where sign [−] denotes the function sign [×]=+1 for $x \geq 0$ sign [×]=−1 for $x \leq 0$ \quad (6)

It follows from the above equations that the maximum control loop response rate is a function of the scaling coefficient K, since the signal power p is limited to the range of the A/D converter 4, and the reference value R is fixed. In the prior art AGC circuit described here and the one described in the following, a single scaling coefficient K is used for setting the maximum control loop response rate. A small scaling coefficient is used in systems where finer gain control and a low control loop response rate is desired; a larger scaling coefficient is used in systems where a higher control loop response rate is desired to rapidly compensate for large fluctuations in signal power.

When the AGC circuit has a low control loop response rate, the AGC circuit provides good compensation for small signal power fluctuations, but performs poorly in response to large signal power fluctuations (such as caused by Rayleigh fading), because too much time is needed to reach the appropriate gain value. On the other hand, when the AGC circuit has a high control loop response rate, the AGC circuit compensates adequately for large signal power fluctuations, but provides less precise control over the amplifier gain for small signal power fluctuations.

Figure 2:
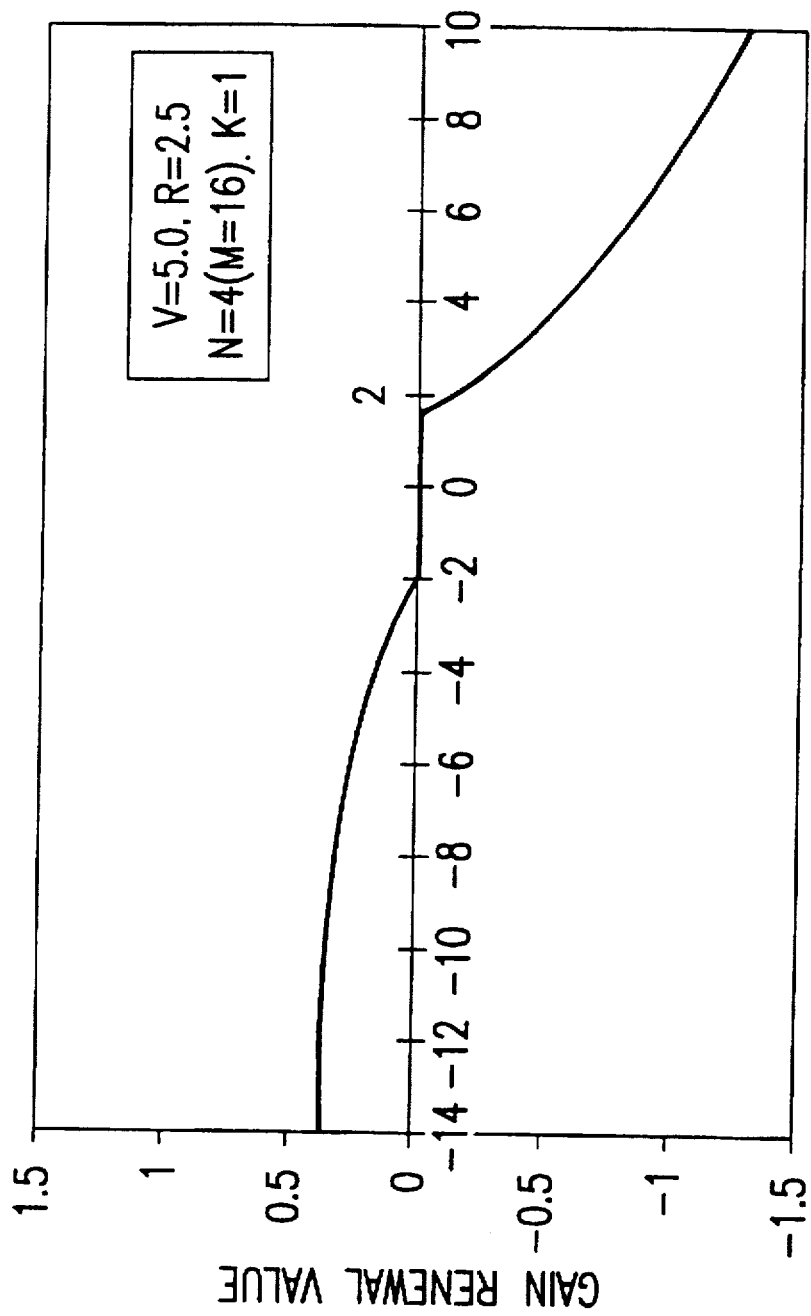
FIG. 2 is a graph illustrating the gain renewal values which are obtained with respect to signal power for the prior art automatic gain control circuit shown in FIG. 1.

FIG. 2 illustrates the input output relationship between the signal power as determined by the power calculation means, expressed as a ratio of the reference value and plotted in dB units (10 log(p/R)), and the gain renewal value at the output of scaling means 10. The values shown in FIG. 2 are obtained for the following specific parameter settings:

V=5.0, R=2.5, K=1.0 and N=4 (M=16)

As is understood by examining FIG. 2, the range of gain renewal values (0 to −1.3) which are obtained for increases in signal power (i.e., 0 dB to +10 dB) are different from the range of gain renewal values (0 to +0.4) which are obtained for decreases in signal power (i.e., 0 dB to −14 dB). This difference in the magnitude ranges of gain renewal values for positive and negative changes in signal power can be referred to as asymmetric control loop response.

The prior art example AGC circuit also results in a constant zero gain renewal value over the signal power range −2 dB to +2 dB. As described above, this result is due to the substitution of the constant zero in place of the actual logarithmic value for small control error values near zero. Zero value substitution, as performed by the prior art AGC circuit, results in no change in amplifier gain for small changes in input signal level, thus precluding fine control over amplifier gain.

Figure 3:
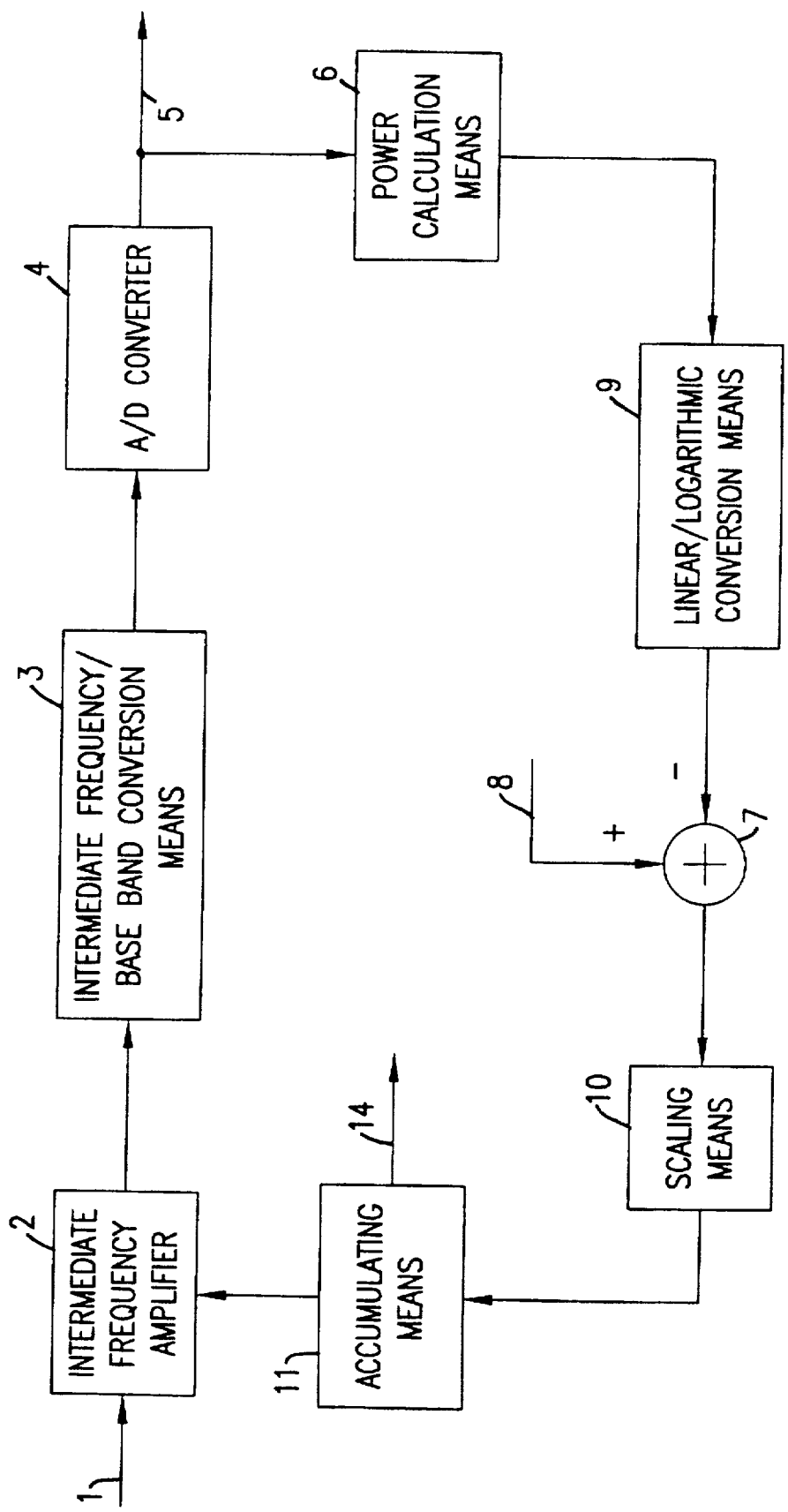
FIG. 3 is a block and schematic diagram of a second example of a prior art automatic gain control circuit.

FIG. 3 is a block and schematic diagram showing another example of a prior art reception AGC circuit. In FIG. 3, reference numerals 1 through 11 and 14 indicate elements which are the same as those shown in FIG. 1. In FIG. 3, however, a circuit arrangement is shown in which linear/logarithmic conversion means 9 converts the signal power output of power calculation means 6 to logarithmic scale prior to subtracting it from the reference value 8 to obtain a control error signal.

With reference to FIG. 3, when reference value 8 is set to log R, the gain renewal value at the output of scaling means 10 has the following relationship to the signal power output p:

$$\text{gain renewal value} = K \log(R/p) \qquad (7)$$

Figure 4:
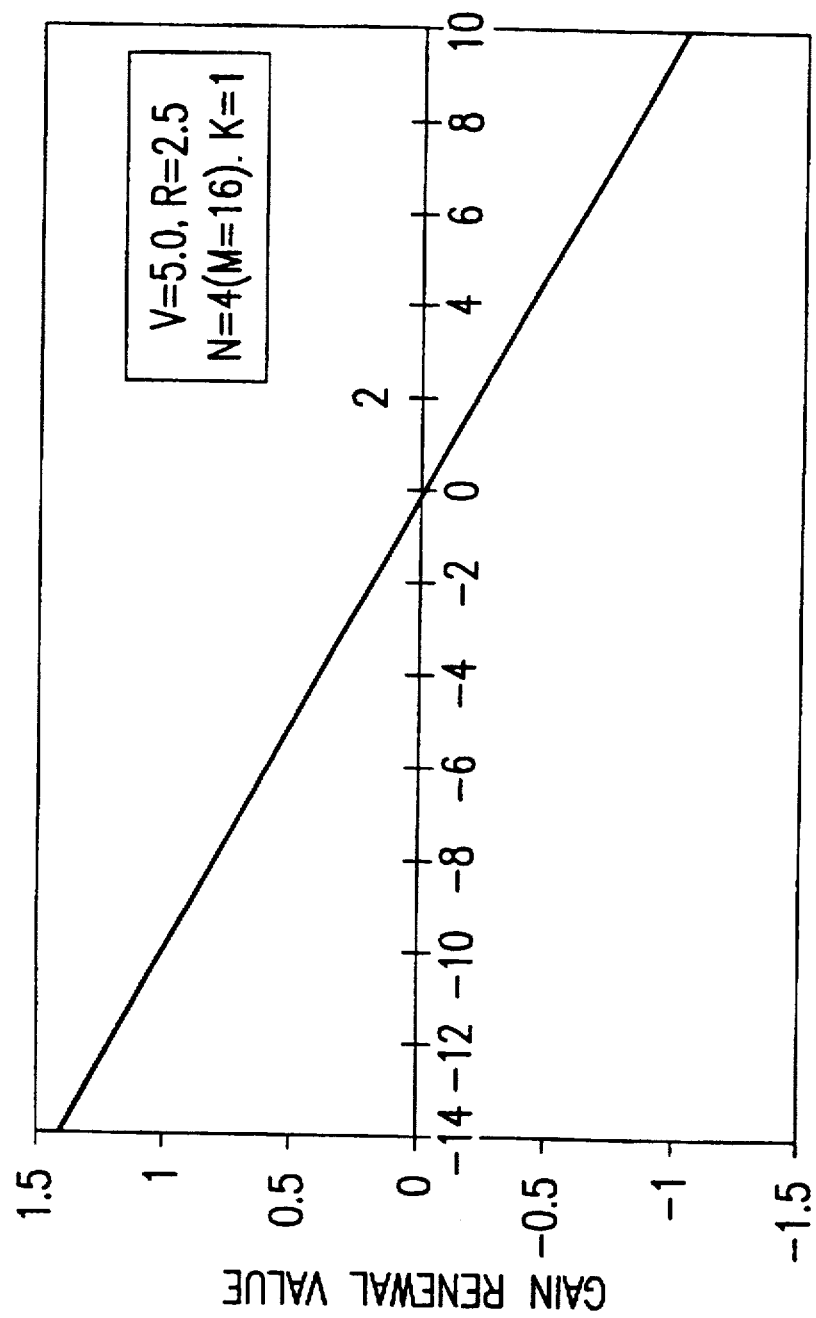
FIG. 4 is a graph illustrating the gain renewal values which are obtained with respect to signal power for the second prior art automatic gain control circuit shown in FIG. 3.

FIG. 4 illustrates the relationship between the signal power output of the power calculation means 6 and the gain renewal values for the prior art example AGC circuit shown in FIG. 3. In FIG. 4, the values shown were obtained for the specific parameter settings:

V=5.0, R=2.5, K=1.0 and N=4 (M=16)

As understood from an examination of FIG. 4, the operation of the prior art AGC circuit results in the maximum and minimum gain renewal values of +1.4 and −1.0, for decreases and increases in signal level, respectively. Since the maximum and minimum gain renewal values differ in magnitude (i.e., +1.4 vs. 1.0), the maximum control loop response rate is different depending on whether the signal level has increased or decreased. As a result, the accuracy of the received signal strength estimate provided by the AGC circuit at the time of signal power fluctuations can vary. Inaccurate estimation of received signal strength results in the mobile station emitting either excessive or insufficient transmission power. This, in turn, leads to reduced system performance, which limits subscriber capacity and/or decreases reception quality.

Accordingly, it is an object of the present invention to provide an automatic gain control system and method which provides a constant control loop response rate for relatively large input signal level changes, and provides a higher control loop response rate for relatively small changes in input signal level.

Another object of the invention is to provide an automatic gain control system and method which provides the same maximum control loop response rates irrespective of the direction of change in input signal level.

Still another object of the invention is to provide an automatic gain control system and method which operates with generally smaller control error values than existing systems and provides a more accurate estimate of the received signal strength of a transmission.

SUMMARY OF THE INVENTION

These and other objects are provided by the automatic gain control (AGC) system and method of the present invention. One embodiment of the AGC system of the present invention is constructed with a control error amplitude-limiting means which eliminates the need for a linear/logarithmic conversion means as used in prior art AGC circuits. Such construction provides a constant control loop response rate for relatively large control errors, and a higher variable control loop response rate for relatively small control errors.

In another embodiment of the present invention, an AGC system and method is provided which reduces asymmetric control loop response of the AGC circuit with respect to positive and negative control error values. The AGC system in this embodiment of the present invention provides these advantages by incorporating a variable scaling means which scales the control error signal with different coefficients selected on the basis of the positive or negative sign of the control error.

Finally, the present invention operates more frequently with a small control error value than existing systems now operate. These effects increase the operational stability of the automatic gain control system and provide more precise control over the amplifier gain. Further, the present invention reduces asymmetric control loop response with respect to positive and negative signal level variations, to provide improved reception quality and increased accuracy in estimating received signal strength.

DETAILED DESCRIPTION OF THE PREFERRED EMBODIMENTS

Figure 5:
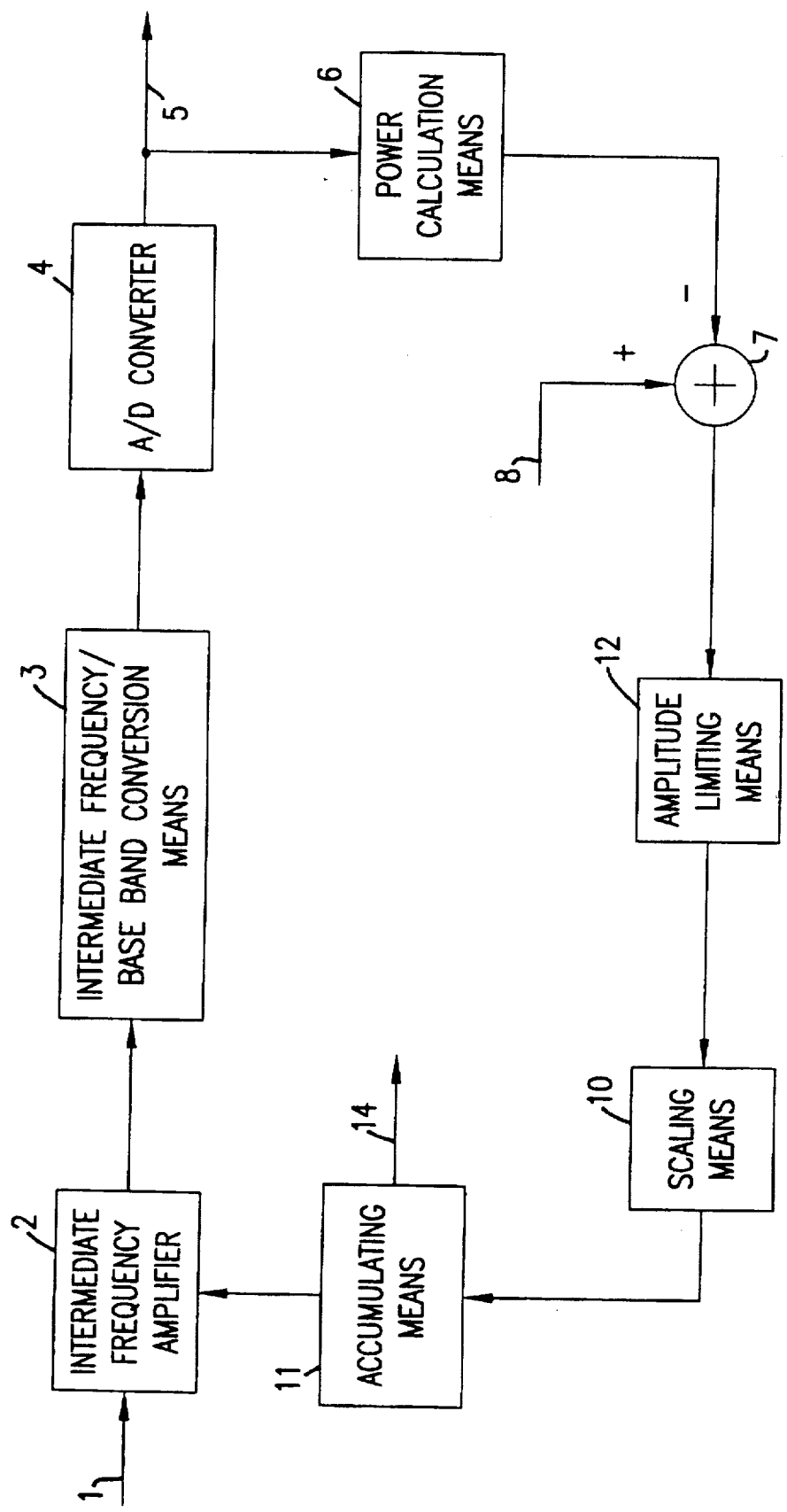
FIG. 5 is a block and schematic diagram of a reception automatic gain control circuit constructed in accordance with a first embodiment of the present invention.

FIG. 5 contains a block and schematic diagram of a first embodiment of a reception automatic gain control (AGC) system constructed in accordance with the present invention. In FIG. 5, reference numerals 1 through 8, 10, 11 and 14 indicate elements and signals which are the same as those of the prior art example AGC circuit described in the foregoing with reference to FIG. 1.

As shown in FIG. 5, the AGC system of the present invention includes an amplitude limiting means 12 used to limit the amplitude of a control error signal to within predetermined limits. The amplitude limiting means 12 may be implemented in any of several well known ways, e.g., (1) by a clipper circuit; (2) a circuit which compares an input signal to two stored thresholds and substitutes the values based thereon; or (3) by table look-up circuitry. The amplitude limiting means 12 can be implemented by hardwired logic or micro- or softcoded elements, such as found in a digital signal processor (DSP).

As the details of the construction of such circuits are well known, they need not be described in any further detail here. In operation, the amplitude limiting means 12 operates upon the control error signal p output by the control error detecting means 7 to output a signal according to the function f as indicated:

$$f(R-p) = \begin{cases} R(1 - 10^{\delta/10}) & \text{for } 10 \log(p/R) \geq \delta \\ R - p & \text{for } \delta > 10 \log(p/R) > -\delta \\ R(1 - 10^{-\delta/10}) & \text{for } 10 \log(p/R) \leq -\delta \end{cases} \quad (8)$$

The operations of the reception AGC system constructed according to the first embodiment of the present invention will now be described. Apart from the amplitude limiting means 12, the elements of the reception AGC system of the present invention operate in the same manner as in the prior art example AGC circuits described in the foregoing. Therefore, only the new features of the present invention need be described here.

Through amplitude-limiting and other operations as described in the foregoing, the reception AGC system provides gain renewal values as indicated below:

$$f(R-p) = \begin{cases} KR(1 - 10^{\delta/10}) & \text{for } 10 \log(p/R) \geq \delta \\ K(R-p) & \text{for } \delta > 10 \log(p/R) > -\delta \\ KR(1 - 10^{-\delta/10}) & \text{for } 10 \log(p/R) \leq -\delta \end{cases} \quad (9)$$

Figure 6:
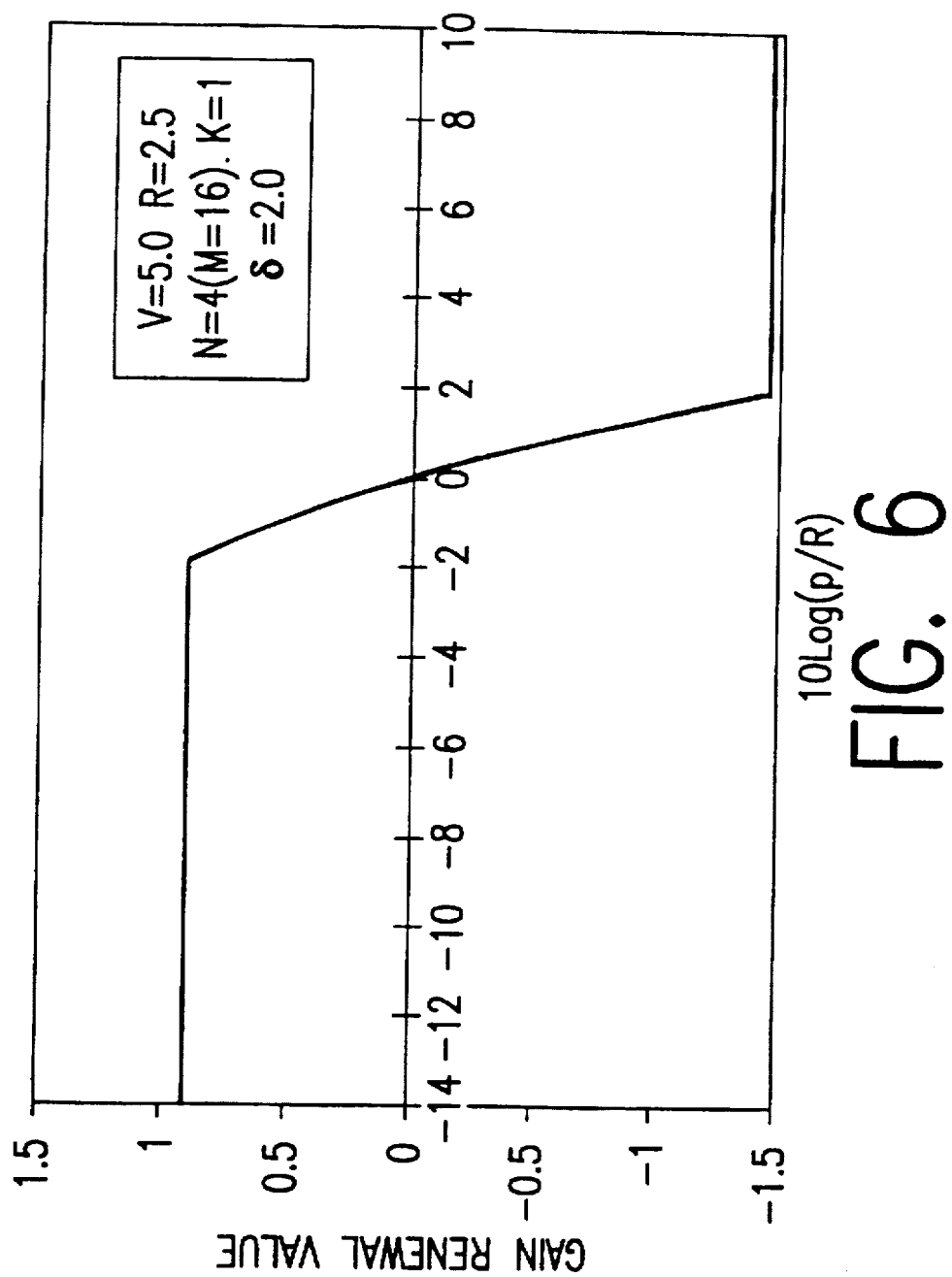
FIG. 6 is a graph illustrating the gain renewal values which are obtained with respect to signal power for the first embodiment of the present invention shown in FIG. 5.

A plot of the numerical gain renewal values which are obtained is shown in FIG. 6 for the specific parameter settings as follows:

V=5.0, R=2.5, K=1.0, N=4 (M=16) and δ=2.0.

As can be seen from FIG. 6, the present invention operates to provide fixed amplitude gain renewal values for relatively large control errors outside of the range −δ to +δ dB, while providing variable gain renewal values for relatively small control errors between −δ and +δ which are determined as a function of control error magnitude. By providing variable gain renewal values for small control errors, the amplifier gain is controlled more precisely, thereby improving signal reception. At the same time, by providing constant gain renewal values for larger control errors, the AGC system responds effectively, and yet with improved stability under such conditions.

Figure 7:
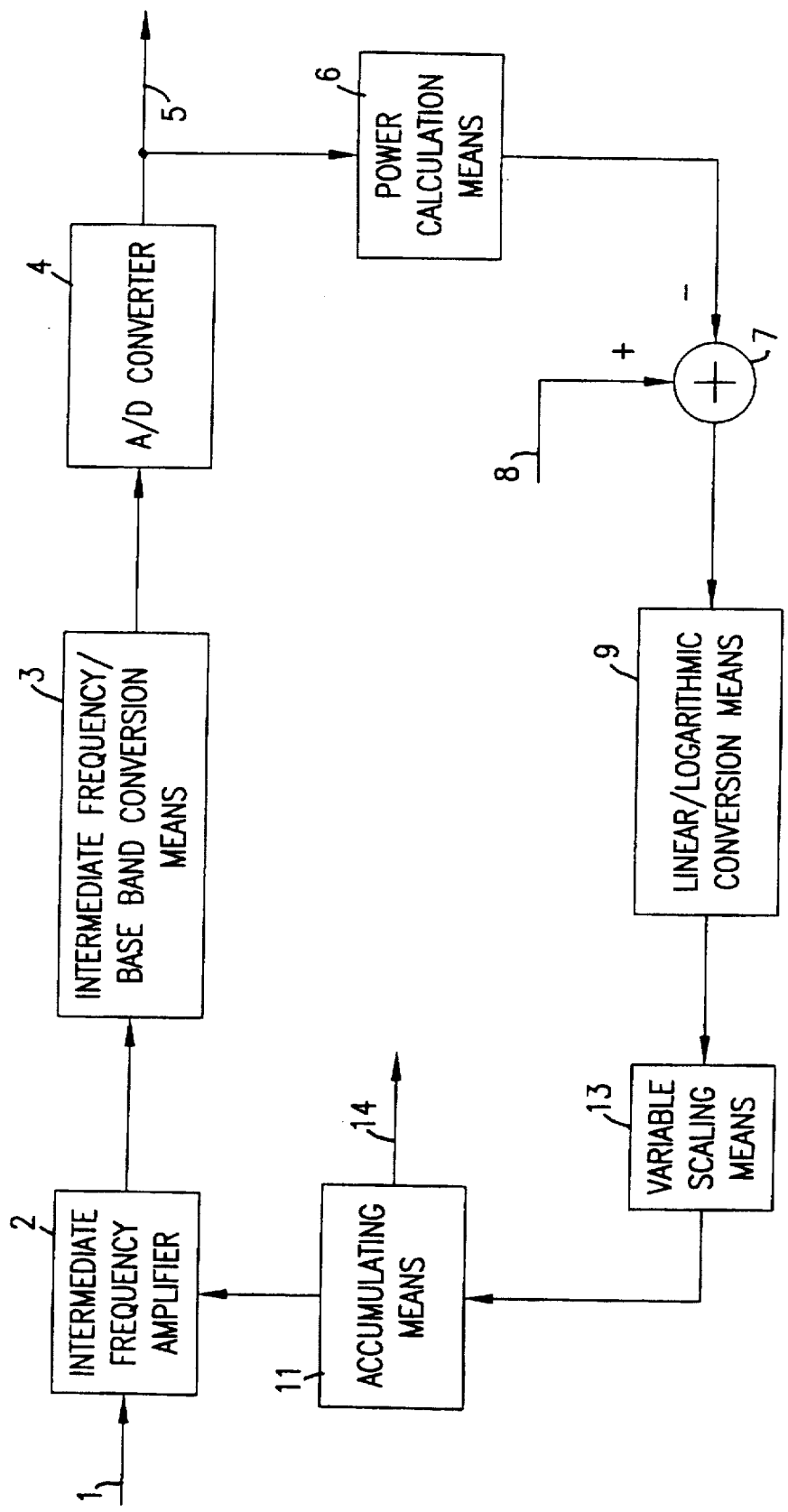
FIG. 7 is a block and schematic diagram of a reception automatic gain control circuit constructed in accordance with a second embodiment of the present invention.

FIG. 7 contains a block and schematic diagram showing the construction of a second embodiment of an automatic gain control (AGC) system constructed in accordance with the present invention. In FIG. 7, reference numerals 1 through 9, 11 and 14 indicate elements which are the same as those of the first example prior art AGC circuit described in the foregoing with reference to FIG. 1. In FIG. 7, variable scaling means 13 is used to scale the logarithmic scale control error output of the linear/logarithmic conversion means 9 with a scaling coefficient selected in accordance with the sign of the control error.

Variable scaling means 13 may be implemented, for example, by hardwired logic or micro- or softcoded elements, such as a digital signal processor (DSP) constructed to determine the positive or negative sign of the control error and to multiply that signal by the selected stored coefficient. Coefficients in the variable scaling means 13 are selected as follows:

for R−p<0, select coefficient K1 for R−p>0, select coefficient K2

Coefficient values K1 and K2 are selected according to the control loop response rate desired following increases or decreases in signal level. For example, if substantially the same control loop response rate is desired to both increases and decreases in signal level which exceed the dynamic range of the A/D converter 4, the coefficients K1 and K2 are selected to provide gain renewal values such as shown in FIG. 8.

Figure 8:
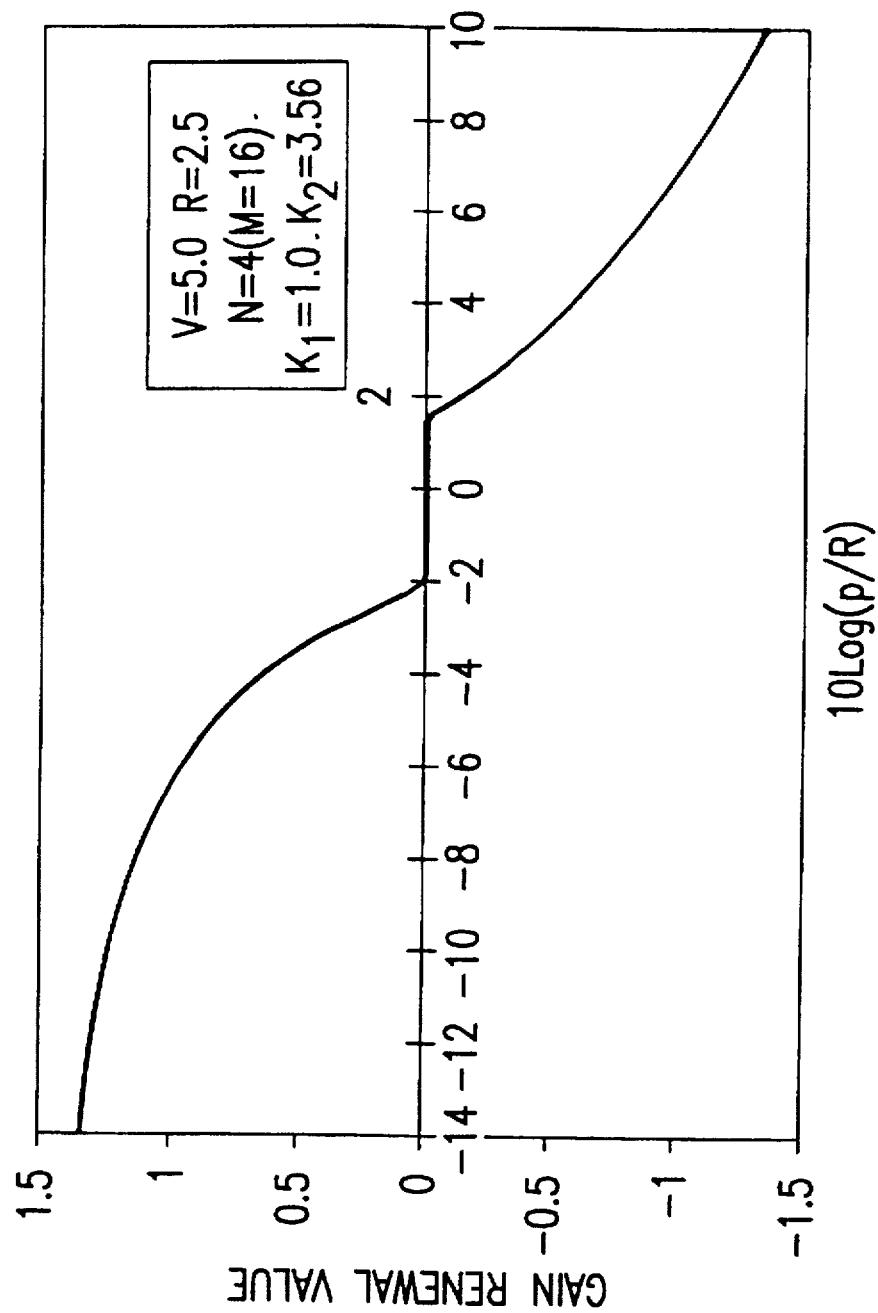
FIG. 8 is a graph illustrating the gain renewal values which are obtained with respect to signal power for the second embodiment of the present invention shown in FIG. 7.

FIG. 8 is a graph showing the input output relationship between the control error signal and the gain renewal values which are obtained. In FIG. 8, the gain renewal values were obtained with the specific parameter settings as follows:

V=5.0, R=2.5, K1=1.0, K2=3.56, and N=4 (M=16)

As can be seen by comparing FIG. 8 to the graph of the prior art AGC circuit operation shown in FIG. 2, the operation of the system of the present invention reduces the difference in control loop response with respect to positive and negative variations in the control error, thereby improving both the reception quality and overall communication system performance.

Figure 9:
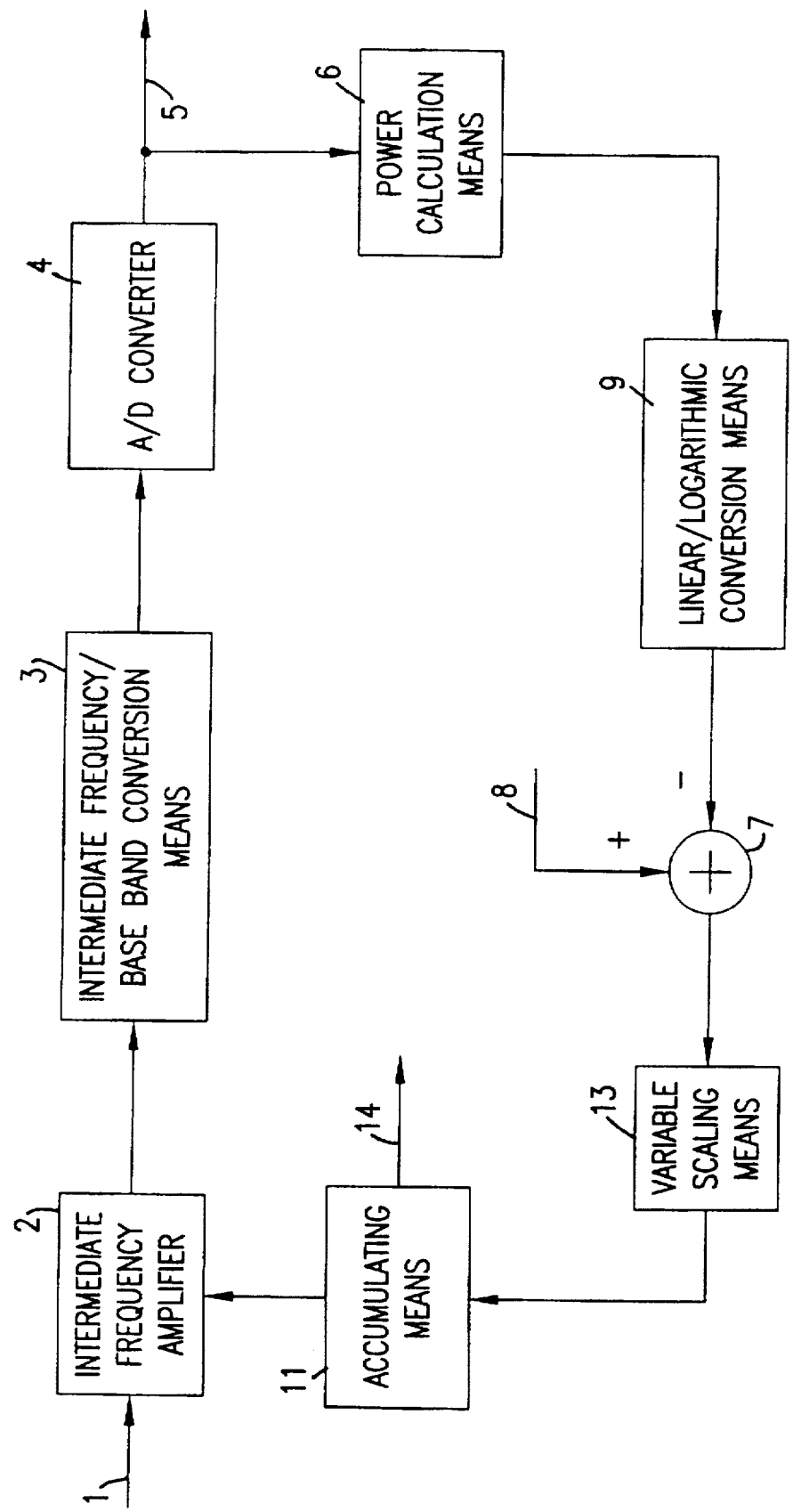
FIG. 9 is a block and schematic diagram of a reception automatic gain control circuit constructed in accordance with a third embodiment of the present invention.

FIG. 9 contains a block and schematic diagram illustrating an automatic gain control system constructed in accordance with a third embodiment of the present invention. In FIG. 9, reference numerals 1 through 9, 11, 13 and 14 indicate elements which are the same as the second embodiment of the present invention described in the foregoing with reference to FIG. 7. The elements of the reception AGC system of the third embodiment of the present invention operate the same as those of the second embodiment except that the linear/logarithmic conversion means 9 is used to perform the logarithmic conversion on the signal power output of the power calculation means 6, and that reference value 8 is provided in logarithmic scale.

Figure 10:
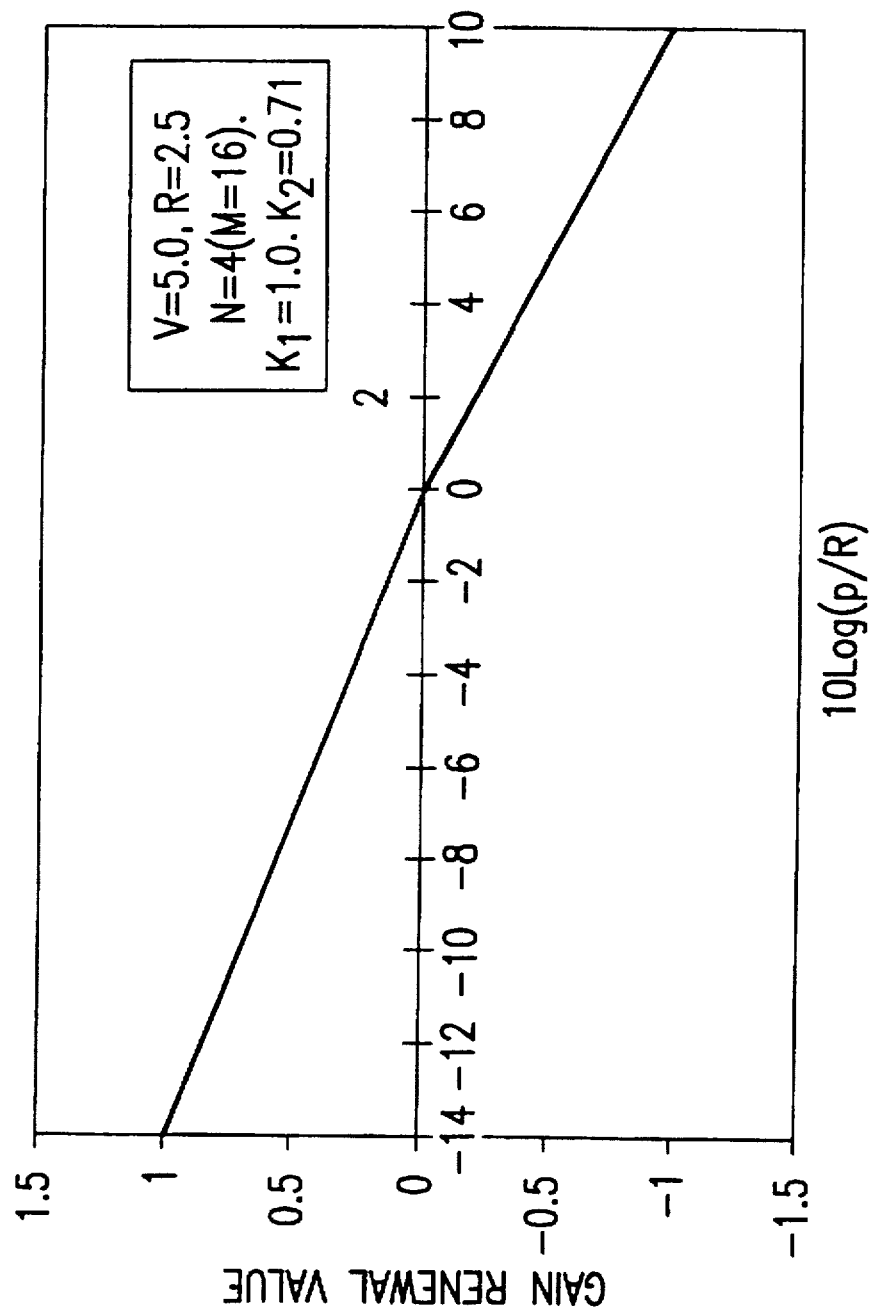
FIG. 10 is a graph illustrating the gain renewal values which are obtained with respect to signal power for the third embodiment of the present invention shown in FIG. 9.

As described above with respect to the second embodiment of the present invention above, the particular values assigned to the coefficients K1 and K2 determine the control loop response rate of the AGC system following increases and decreases in signal level. For example, if control loop response is desired to provide the same response to both increases and decreases in signal level which exceed the dynamic range of the A/D converter 4, the coefficient values K1 and K2 are selected to provide gain renewal values such as shown in FIG. 10. In FIG. 10, the values shown were obtained with the specific parameter settings as follows:

V=5.0, R=2.5, K1=1.0, K2=0.71, and N=4 (M=16)

As understood from an examination of FIG. 10, by operation of the third embodiment of the present invention, the control error is scaled with scaling coefficients which are selected on the basis of the sign of the control error. As a result, the maximum control loop response rates become the same for positive and negative control errors.

Figure 11:
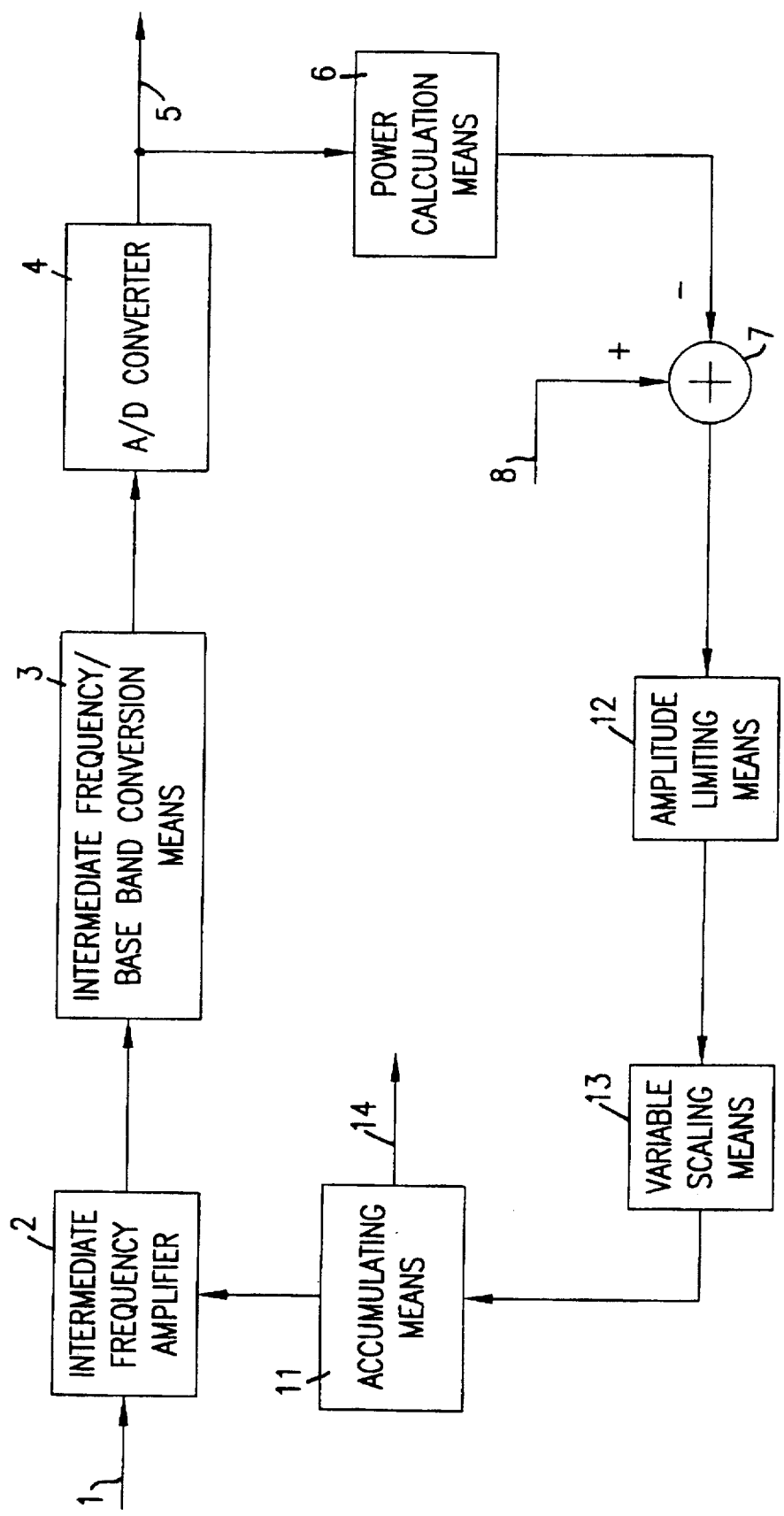
FIG. 11 is a block and schematic diagram of a reception automatic gain control circuit constructed in accordance with a fourth embodiment of the present invention.

FIG. 11 contains a block and schematic diagram illustrating an AGC system constructed in accordance with a fourth embodiment of the present invention. In FIG. 11, reference numerals 1 through 8, 11, 12 and 14 indicate the same elements as shown and described for the first embodiment in the foregoing with reference to FIG. 5. Variable scaling means 13 has the same construction and operates in the same manner as that described with reference to FIG. 7 in the foregoing description of the second embodiment of the invention.

Except as to the variable scaling means for scaling the control error with a coefficient selected in accordance with the sign of the control error, the operation of the fourth embodiment of the invention is the same as that of the first embodiment of the invention described in the foregoing.

Figure 12:
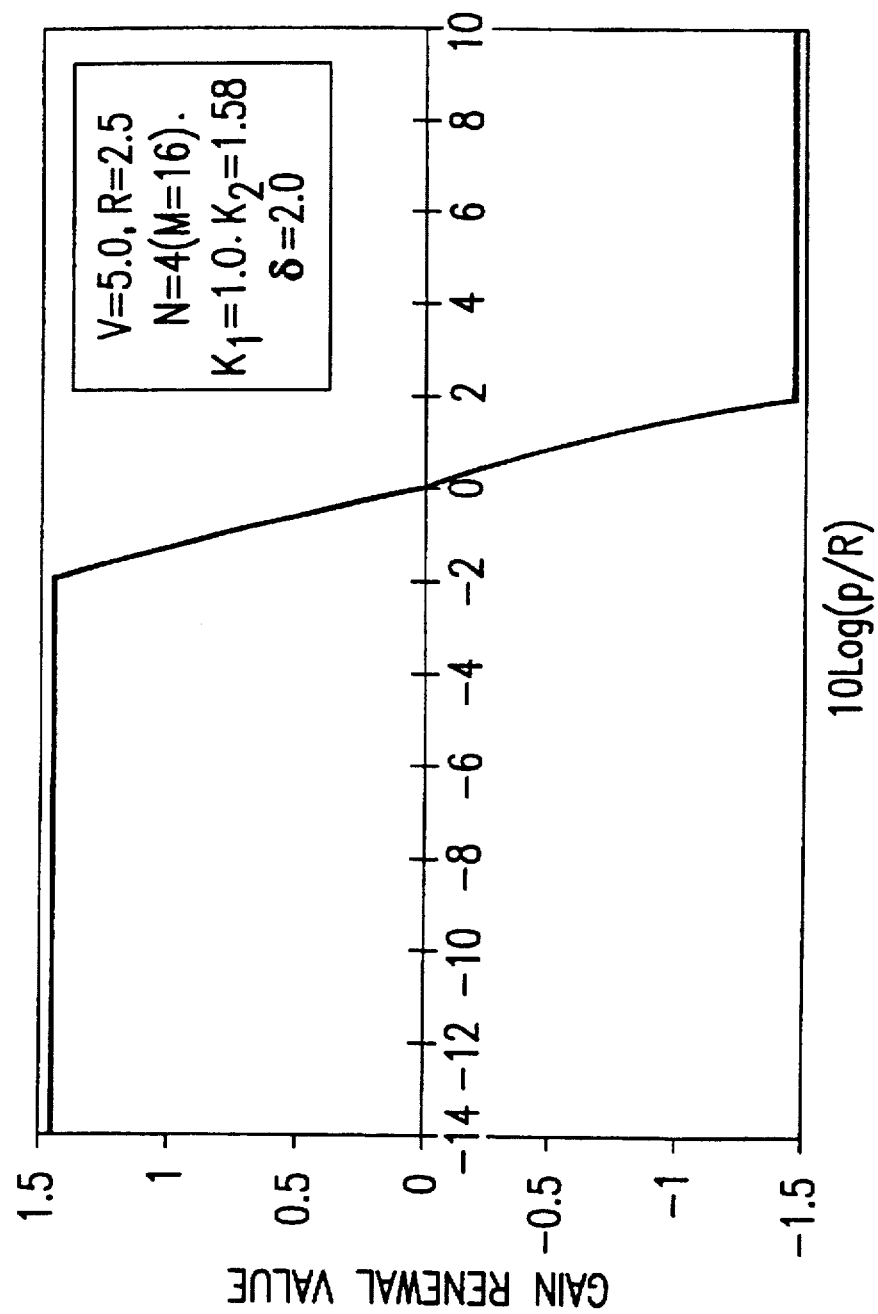
FIG. 12 is a graph illustrating the gain renewal values which are obtained with respect to signal power for the fourth embodiment of the present invention shown in FIG. 11.

As described in the foregoing, the values assigned to the coefficients K1 and K2 determine the control loop response of the automatic gain control system in response to increases and decreases in signal level. For example, if a control loop response is desired in which the AGC system responds the same for both sudden increases and decreases in signal level which exceed the dynamic range of the A/D converter 4, the coefficient values K1 and K2 are selected to provide gain renewal values such as shown in FIG. 12. In FIG. 12, the values were obtained with the specific parameter settings as follows:

$$V=5.0, R=2.5, K1=1.0, K2=1.58, N=4 (M=16) \text{ and } \delta=2.0$$

As can be seen from an examination of FIG. 12, the AGC system of the fourth embodiment provides maximum gain renewal values which have the same magnitude for both positive and negative control errors, i.e., 1.45.

The AGC system of the fourth embodiment of the present invention operates to provide an amplitude limited control error, and a gain renewal value which is scaled according to the sign of the control error. As a result, gain renewal values are produced which provide rapid, variable rate control loop response for relatively small control errors, and constant rate control loop response for relatively large control error values. In addition, the difference in maximum control loop response rates for increases and decreases in signal power is eliminated. As a result, signal reception and accuracy in estimating received signal strength are improved, which thereby improve the overall performance of the mobile communication system.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An automatic gain control system responsive to gain renewal values generated therein, comprising:
   control error detecting means for providing control error signals; and
   amplitude limiting means coupled directly to said control error detecting means for amplitude limiting said control error signals;
   scaling means coupled to said amplitude limiting means to scale the output therefrom and generate said gain renewal values,
   said amplitude limiting means and said scaling means acting to reduce asymmetric control loop response of said automatic gain control system.

2. The automatic gain control system of claim 1 wherein said scaling means provides a fixed scaling factor.

3. The automatic gain control system of claim 1 wherein said scaling means provides variable scaling factors having values dependent on the sign of said control error signals.

4. The automatic gain control system of claim 1 wherein said amplitude limiting means provides a variable magnitude output when said control error signals lie within a predetermined range of magnitudes and a constant magnitude output when said control error signals exceed said predetermined range.

5. The automatic gain control system of claim 1 wherein said control error signals are linear with respect to power of a signal input to said automatic gain control system.

6. An automatic gain control system responsive to gain renewal values generated therein, comprising:
   control error detecting means for providing control error signals; and
   variable scaling means coupled to said control error detection means for variably scaling said control error signals in accordance with the sign of said control error signals to generate said gain renewal values, said variable scaling means acting to reduce asymmetric control loop response of said automatic gain control system.

7. The automatic gain control system of claim 6 further including a linear to logarithmic converter coupled to the input of said control error detecting means.

8. The automatic gain control system of claim 6 further including a linear to logarithmic converter coupled between said control error detecting means and said variable scaling means.

9. A method for generating gain renewal values to control the gain of an automatic gain control system comprising the steps of:
   generating control error signals;
   amplitude limiting said control error signals to generate amplitude-limited control signals; and
   scaling said amplitude-limited control signals to generate gain renewal values which reduce asymmetric control loop response of said automatic gain control system.

10. The method of claim 9 wherein said step of scaling provides fixed scaling of said amplitude-limited control signals.

11. The method of claim 9 wherein said step of scaling provides variable scaling of said amplitude-limited control signals in accordance with the sign of said control error signals.

12. A method for generating gain renewal values for controlling the gain of an automatic gain control system comprising the steps of:
   generating control error signals which are linear with respect to the detected power of a signal input to said automatic gain control system;
   converting said control error signals to logarithmic error signals; and
   variably scaling said logarithmic error signals to generate gain renewal values which reduce asymmetric control loop response of said automatic gain control system.

13. A method for generating gain renewal values for controlling an automatic gain control system, comprising the steps of;
   generating control error signals which are logarithmic with respect to power of a signal input to said automatic gain control system; and
   variably scaling said control error signals by factors selected in accordance with the sign of said control error signals, said factors selected to reduce asymmetric control loop response of said automatic gain control system.

14. An automatic gain control system comprising:
   a variable gain amplifier for receiving and amplifying a communication signal in accordance with gain control values input thereto;
   analog to digital converter means for converting said amplified communication signal to digital form;

power calculation means for calculating the power of said digitally converted communication signal;

control error detecting means for generating control error signals representing a deviation of said calculated power from a predetermined reference; and processing means responsive to said control error signals for generating gain renewal values by scaling said control error signals with scale factors depending upon the sign of said control error signals selected to reduce asymmetric control loop response of said automatic gain control system, said gain renewal values being used to adjust said gain control values input to said variable gain amplifier.

15. The automatic gain control system of claim 14 wherein said processing means scales said control error signals with variable scale factors.

16. The automatic gain control system of claim 14 wherein said processing means further comprises amplitude limiting means for amplitude limiting said control error signals.

17. The automatic gain control system of claim 16 wherein said processing means scales said control error signals with variable scale factors.

18. The automatic gain control system of claim 6 further including amplitude limiting means for providing amplitude limited control errors to said variable scaling means.

19. The automatic gain control system of claim 6 wherein said variable scaling means generates gain renewal values which are substantially the same for positive and negative control error signals of the same magnitude.

* * * * *